United States Patent
Yoneda et al.

(10) Patent No.: US 10,585,239 B2
(45) Date of Patent: Mar. 10, 2020

(54) PHOTODIODE DEVICE MONOLITHICALLY INTEGRATING WAVEGUIDE ELEMENT WITH PHOTODIODE ELEMENT TYPE OF OPTICAL WAVEGUIDE

(71) Applicant: SUMITOMO ELECTRIC DEVICE INNOVATIONS, INC., Kanagawa (JP)

(72) Inventors: Yoshihiro Yoneda, Yokohama (JP); Takuya Okimoto, Yokohama (JP); Kenji Sakurai, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 16/290,671

(22) Filed: Mar. 1, 2019

(65) Prior Publication Data
US 2019/0271808 A1  Sep. 5, 2019

(30) Foreign Application Priority Data

Mar. 2, 2018  (JP) .................................. 2018-037296
May 9, 2018  (JP) .................................. 2018-090558

(51) Int. Cl.
| | |
|---|---|
| *G02B 6/12* | (2006.01) |
| *G02B 6/42* | (2006.01) |
| *H01L 31/105* | (2006.01) |
| *H01L 31/0304* | (2006.01) |
| *H01L 31/0232* | (2014.01) |

(52) U.S. Cl.
CPC ....... *G02B 6/12004* (2013.01); *G02B 6/4206* (2013.01); *H01L 31/02327* (2013.01); *H01L 31/03042* (2013.01); *H01L 31/03046* (2013.01); *H01L 31/105* (2013.01); *G02B 2006/12078* (2013.01); *H01L 2924/10337* (2013.01)

(58) Field of Classification Search
None
See application file for complete search history.

(56) References Cited

U.S. PATENT DOCUMENTS

| | | | | |
|---|---|---|---|---|
| 5,521,994 A | * | 5/1996 | Takeuchi | ............... B82Y 20/00 257/E31.033 |
| 6,710,378 B1 | * | 3/2004 | Makiuchi | ........... G02B 6/12004 257/184 |

(Continued)

FOREIGN PATENT DOCUMENTS

JP    2013110207 A    6/2013

*Primary Examiner* — Michael Stahl
(74) *Attorney, Agent, or Firm* — Baker Botts L.L.P.; Michael A. Sartori

(57) ABSTRACT

A photodiode (PD) device that monolithically integrates a PD element with a waveguide element is disclosed. The PD device includes a conducting layer with a first region and a second region next to the first region, where the PD element exists in the first region, while, the waveguide element exists in the second region and optically couples with the PD element. The waveguide element includes a core layer and a cladding layer on the conducting layer, which forms an optical confinement structure. The PD element includes an absorption layer on the conducting layer and a p-type cladding layer on the absorption layer, which form another optical confinement structure. The absorption layer has a length at least 12 μm measured from the interface against the core layer.

18 Claims, 14 Drawing Sheets

(56) References Cited

U.S. PATENT DOCUMENTS

| | | | |
|---|---|---|---|
| 2003/0098408 A1* | 5/2003 | Yasuoka | G02B 6/12004 250/214.1 |
| 2004/0145025 A1* | 7/2004 | Yasuoka | G02B 6/1228 257/432 |
| 2010/0054761 A1* | 3/2010 | Chen | H04B 10/60 398/212 |
| 2012/0235265 A1* | 9/2012 | Takabayashi | H01L 31/105 257/432 |
| 2013/0001643 A1* | 1/2013 | Yagi | H01L 31/105 257/184 |

* cited by examiner

PHOTODIODE DEVICE MONOLITHICALLY INTEGRATING WAVEGUIDE ELEMENT WITH PHOTODIODE ELEMENT TYPE OF OPTICAL WAVEGUIDE

CROSS REFERENCE TO RELATED APPLICATIONS

The present application claims benefit of Japanese Priority Applications of JP2018-037296 filed on Mar. 2, 2018 and JP2018-090558 filed on May 9, 2018, which are incorporated herein as references.

BACKGROUND

1. Field of Invention

The present invention relates to a photodiode with a type of optical waveguide.

2. Related Background Arts

A Japanese Patent Application laid open No. JP2013-110207A has disclosed a photodiode device that monolithically integrates a waveguide element and a photodiode element with a type of optical waveguide optically coupled with the optical element on a substrate common to the waveguide element and the photodiode element.

An optical communication system currently installed often configures, what is called, the wavelength division multiplexing (WDM) using wavelengths of 1528 to 1565 nm, which is often called as the C-band in the field. As the capacity of data to be transmitted explosively increases, an optical communication system using longer wavelengths, specifically, 1565 to 1612 nm, which is called as the L-band, has been investigate. However, a PD commercially available in the field often shows large temperature dependence, especially in optical sensitivity thereof, in the L-band. For instance, the optical sensitivity of a PD widely degrades at a temperature lower than 0° C. Accordingly, an advanced PD applicable to the L-band at a low temperature has been demanded.

Also, a future optical communication system inevitably requests a high speed operation exceeding 400 Gb/s and a complex modulation configuration such as multi-level amplitude modulation combined with a phase modulation. Accordingly, a photodiode applicable such high speed and high degree of optical modulation will be inevitably requested to be operable in higher frequencies. A waveguide PD is determined in frequency response thereof primarily by a time constant caused by parasitic and inherent capacitance and resistance attributed to structures around an absorption layer thereof and a carrier transport time within the absorption layer. In order to enhance the frequency response, both the carrier transport time and the time constant are preferably shorter. However, a thinned absorption layer to shorten the carrier transport time inevitably increases the capacitance thereof to increase the time constant. Accordingly, the field has also requested to make above two subjects consistent to each other.

SUMMARY

An aspect of the present invention relates to a photodiode device that integrates a waveguide element with a photodiode element type having a waveguide structure. The photodiode device includes a substrate, the photodiode element and the waveguide element. The substrate provides a conducting layer doped with n-type impurities, the conducting layer having a first region and a second region next to the first region. The waveguide element, which is provided in the first region of the conducting layer, includes a core layer on the conducting layer and a cladding layer on the core layer. The photodiode element, which is provided in the second region of the conducting layer and optically coupled with the waveguide element, includes an absorption layer provided on the conducting layer and having a bandgap wavelength longer than 1612 nm, where the absorption layer abuts against the core layer in the guide element, and a p-type cladding layer provided on the absorption layer and doped with p-type impurities. A feature of the photodiode device of the present invention is that the absorption layer in the photodiode element has a length at least 12 µm along an optical axis thereof measured from an interface against the core layer in the waveguide element.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION

Next, some embodiments according to the present invention will be described referring to drawings. The present invention is not restricted to those embodiments and has a scope defined in claims attached hereto but may cover all changes and modifications for element in the claims and equivalents thereto. In the description of the drawings, numerals and/or symbols same with or similar to each other will refer to elements same with or similar to each other without duplicating explanations. Also, a term "un-dope" in the specification means that a semiconductor material is not intentionally doped and has impurity density smaller than, for instance, $1 \times 10^{15}$ cm$^{-3}$.

Figure 1:
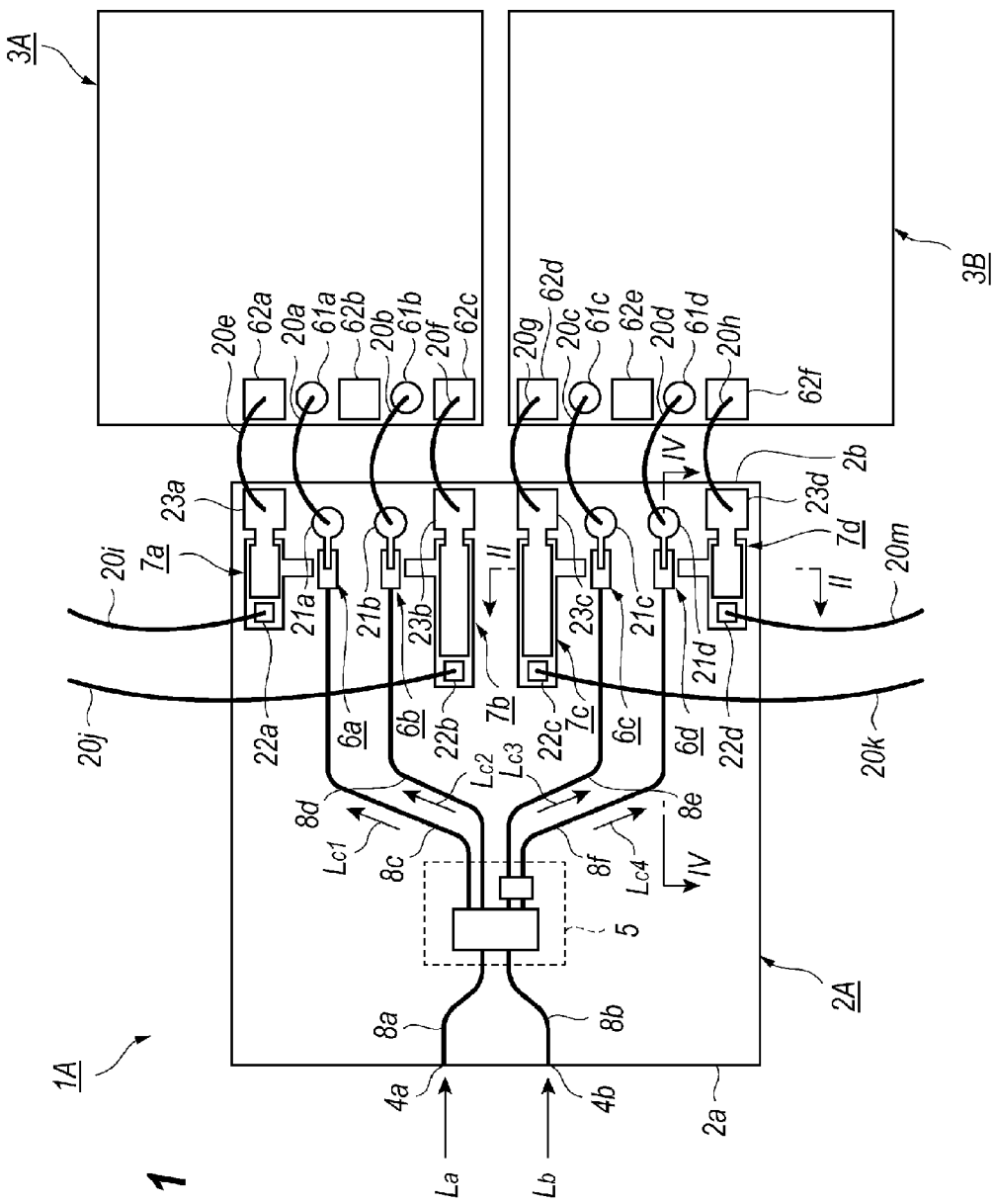
FIG. 1 is a plan view showing an optical device providing a photodiode (PD) unit that monolithically integrates PD elements with waveguide elements on a substrate.

As shown in FIG. 1, the optical device 1A includes a photodiode device 2A and amplifying units, 3A and 3B. The PD device 2A includes waveguide elements formed on a substrate made of semiconductor material, typically indium phosphide (InP), having a rectangular slab shape. The PD device 2A provides two input ports, 4a and 4b, an optical coupler 5, four PD elements, 6a to 6d, and four capacitor elements, 7a to 7d, all of which are integrally formed on the semiconductor substrate.

The PD device 2A in the rectangular slab thereof has a pair of edges, 2a and 2b, where the former edge 2a provides the input ports, 4a and 4b. One of the input ports 4a optically couples with an external fiber to receive an optical signal $L_a$ that multiplexes four signal components, $L_{C1}$ to $L_{C4}$, configured with the quadrature phase shift keying (QPSK). The signal components, $L_{C1}$ to $L_{C4}$, are multiplexed in a wavelength band of 1565 to 1612 nm, which corresponds to the L-band defined in the international telecommunication union telecommunication standardization (ITU-T). The other input port 4b receives a local signal $L_b$. Two input ports, 4a and 4b, optically couple with the optical coupler 5 through waveguide elements, 8a and 8b, where the waveguide elements, 8a and 8b, and other waveguide elements, 8c to 8f, are formed by a core layer and two or more cladding layers each having refractive indices smaller than that of the core layer and surrounding the core layer.

The optical coupler 5, which includes multi-mode interference (MMI) couplers, configures an optical 90° hybrid to extract the four signal components, $L_{C1}$ to $L_{C4}$, contained in the optical signal $L_a$ by performing interference between the optical signal $L_a$ and the local signal $L_b$. Former two signal components, $L_{C1}$ and $L_{C2}$, have phases difference by π from each other, while, latter two signal components, $L_{C3}$ and $L_{C4}$, also have phases difference by π from each other but different from 90° from corresponding to the former signal components, $L_{C1}$ and $L_{C2}$. That is, the former two signal components, $L_{C1}$ and $L_{C2}$, are often called as the in-phase component, while, the latter two signal components, $L_{C3}$ and $L_{C4}$, are called as the quadrature component.

Figure 5:
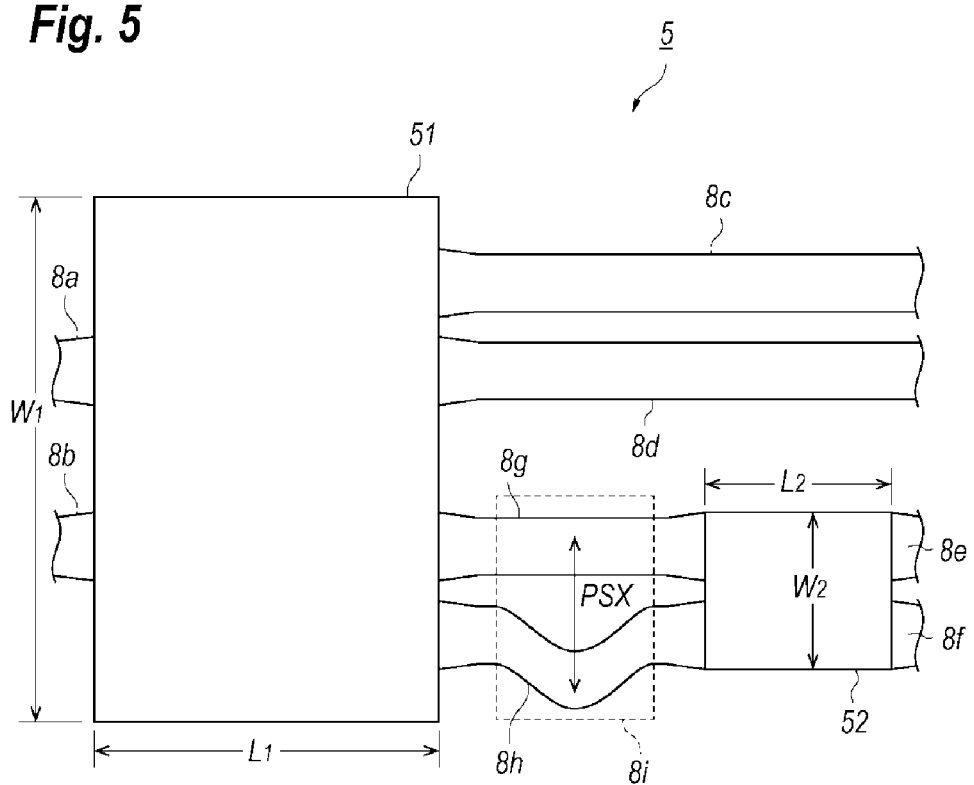
FIG. 5 is a plan view magnifying an optical coupler monolithically integrated in the PD device.

FIG. 5 is a plan view magnifying the optical coupler 5. As shown in FIG. 5, the optical coupler 5 provides two MMI couplers, 51 and 52, where the former coupler 51 has the configuration of two-inputs by four-outputs (2×4), while, the latter coupler 52 has the configuration of two-inputs by two-outputs (2×2). The 2×4 coupler 51 in one of input ports couples with the waveguide element 8a, while, the other input port couples with the waveguide element 8b. Two of output ports of the first MMI coupler 51 couples with two input ports of the other MMI coupler 52 through waveguide elements, 8g and 8h, with restive optical lengths different from each other. That is, the waveguide element 8h bends outwardly in a phase shifter 8i so as to be apart from the other waveguide 8g, which sets the optical length of the waveguide element 8h to be longer than the optical length of the other waveguide element 8g. Thus, light propagating in the waveguide element 8h is delayed in a phase thereof against the other light propagating in the waveguide element 8g. The other two output ports of the 2×4 MMI coupler 51 directly couple with the waveguide elements, 8c and 8d. Also, two output ports of the 2×2 MMI coupler 52 couple with the waveguide elements, 8e and 8f.

Figure 2:
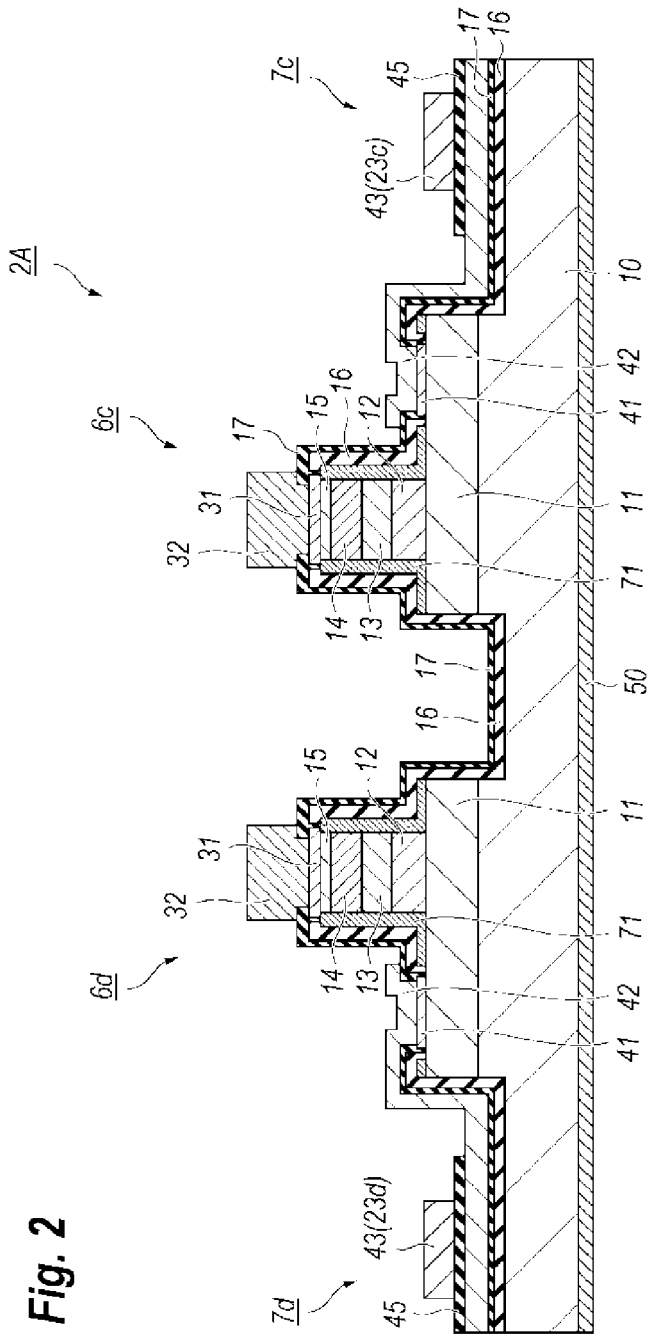
FIG. 2 is a cross sectional view of the PD device taken along the line II-II indicated in FIG. 1.
Figure 3:
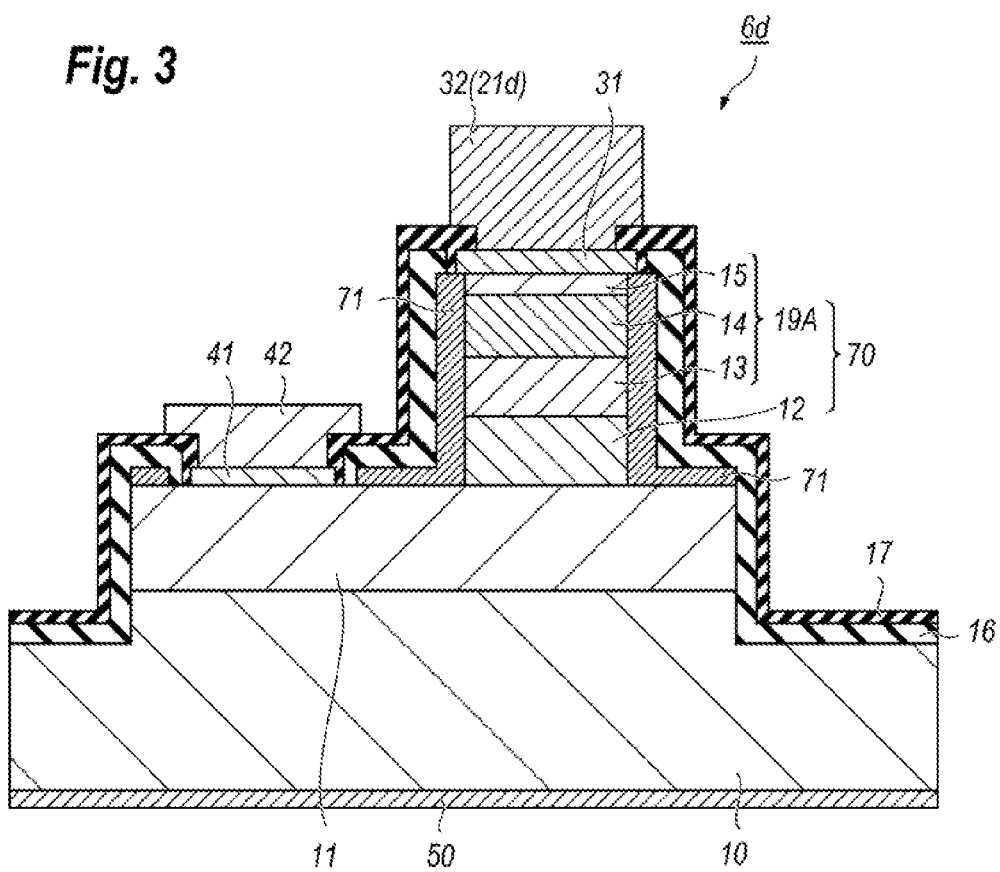
FIG. 3 magnifies a portion of a PD element shown in FIG. 2.

Referring to FIG. 1 to FIG. 4 again, the PD elements, 6a to 6d, which have an arrangement of a PIN photodiode, are disposed along the edge 2b of the PD device 2A. The PD elements, 6a to 6d, each optically couple with the four outputs of the optical coupler 5 through the respective waveguide elements, 8c to 8f. The PD elements, 6a to 6d, which are supplied with constant biases in respective cathodes thereof, receive the signal components, $L_{C1}$ to $L_{C4}$, from the optical coupler 5 through the waveguide elements, 8c to 8f, and generate photocurrents corresponding to the signal components, $L_{C1}$ to $L_{C4}$. The PD device 2A provides signal pads, 21a to 21d, which are disposed along the edge 2b, each corresponding to the PD elements, 6a to 6d, and being electrically connected with anodes of the PD elements, 6a to 6d, through bonding wires, 20a to 20d.

The capacitor elements, 7a to 7d, are a type of metal-insulator-metal (MIM) capacitor providing a lower metal layer, an upper metal layer, and an insulating film 45 sandwiched by the lower and upper metal layers. The lower and upper metal layers are stacked metals of, for instance, titanium-tungsten and gold (TiW/Au), titanium, platinum, and gold (Ti/Pt/Au), and so on. The capacitor elements, 7a to 7d, which are disposed in side by side with respect to the PD elements, 6a to 6d, along the edge 2b, are connected between bias interconnections 42, which supply the biases to the PD elements, 6a to 6d, and the ground as the upper metal layer. The bias interconnections 42 are the lower metal layers in the capacitor elements, 7a to 7d; while, the upper metal layers 43 in the capacitor elements, 7a to 7d, are extracted to ground pads, 23a to 23d, that are connected with a back metal provided in a back surface of the substrate 10 through substrate vias, which are not illustrated in the figures.

The capacitor elements, 7a to 7d, in the respective lower metal layers 42 extend to the bias pads, 22a to 22d; while, the upper metal layers 43 extend to the ground pads, 23a to 23d, disposed closer to the edge 2b. Thus, the capacitor elements, 7a to 7d, are disposed between the bias pads, 22a to 22d, and the ground pads, 23a to 23d. The bias pads, 22a to 22d, receive the biases form the outside of the PD device 2A through bonding wires, 20i to 20m. The ground pads, 23a to 23d, are connected with ground pads, 62a, 62c, 62d, and 62f, in the amplifying units, 3A and 3B, through bonding wires, 20e to 20h.

Thus, the PD device 2A of the present embodiment monolithically integrates, on the substrate 10, the capacitor elements, 7a to 7d, and the PD elements, 6a to 6d, where both elements are closely and densely arranged along the edge 2b of the substrate 10. Moreover, the upper metal layers 43 of the capacitor elements, 7a to 7d, are grounded to the back metal 50 of the substrate 10 through the substrate vias and connected with the ground of the amplifying units, 3A and 3B, through the back metal 50, which may enhance and stabilize the ground around the PD device 2A.

The amplifying units, 3A and 3B, which are a type of trans-impedance amplifier (TIA) that converts photocurrents generated by the PD elements, 6a to 6d, into respective voltage signals, are disposed behind the PD device 2A. Specifically, the amplifying unit 3A, which provides two signal pads, 61a and 61b, differentially and complementarily coverts the photocurrents entering the signal pads, 61a and 61b, into a voltage signal; while, the other amplifying unit 3B, which also provides two signal pads, 61c and 61d, differentially and complementarily converts the photocurrents entering thereto into another voltage signal. The signal pads, 61a to 61d, are arranged along the edge 2b of the PD device 2A and coupled with the signal pads, 21a to 21d, in the PD device 2A through respective boding wires, 20a to 20d.

The amplifying unit 3A further provides three ground pads, 62a to 62c, arranged along the edge 2b of the PD device 2A such that the former two ground pads, 62a and 62b, places the signal pad 61a therebetween, while, the latter two ground pads, 62b and 62c, places the other signal pad 61b therebetween, where outer two ground pads, 62a and 62c, are connected with the ground pads, 23a and 23b, in the PD device 2A through bonding wires, 20e and 20f, but the center ground pad 62b is not directly coupled with the PD device 2A. Also, the other amplifying unit 3B provides three ground pads, 62d to 62f, arranged along the edge 2b such that the former two ground pads, 62d and 62e, put the signal pad 61c therebetween, while, the latter two ground pads, 62e and 62f, put the other signal pad 61d therebetween, where the outer two ground pads, 62d and 62f, are coupled with the ground pads, 23c and 23d, in the PD device 2A through respective bonding wires, 20f and 20h, but the center ground pad 62e is not directly coupled with the PD device 2A.

Figure 4:
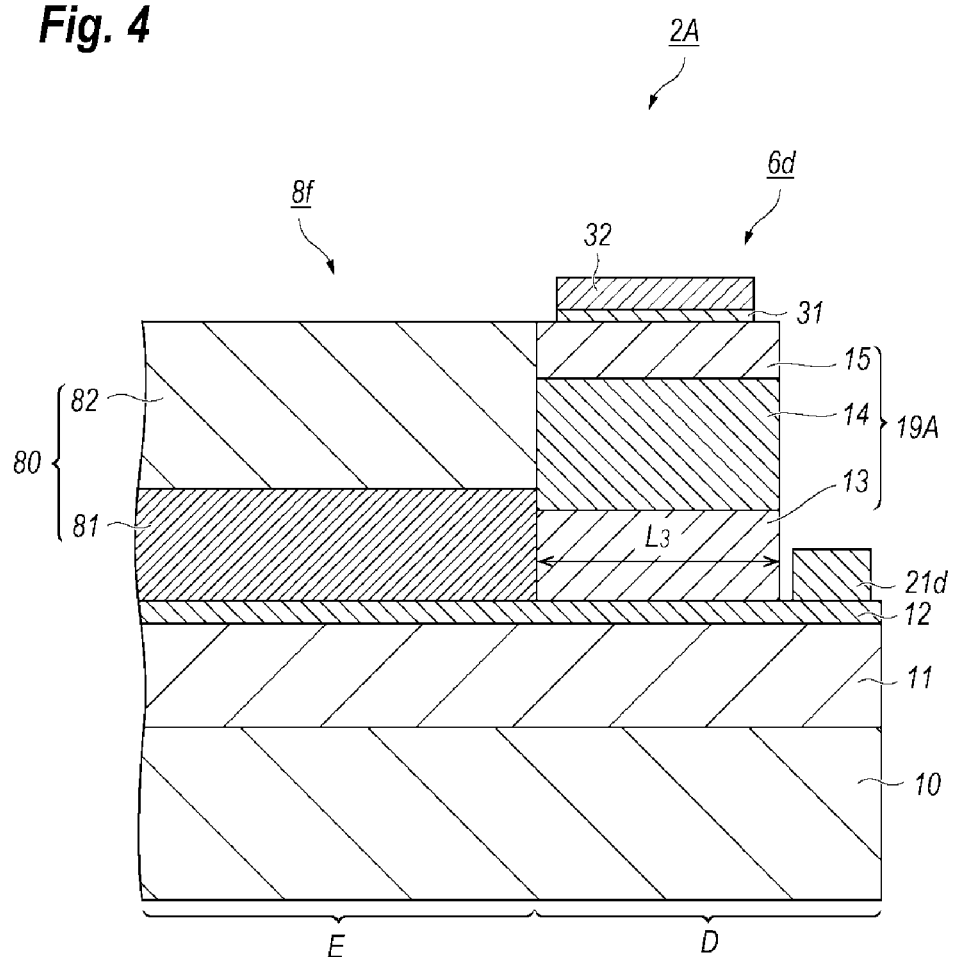
FIG. 4 is a cross sectional view of a PD element and a waveguide element that are taken along the line IV-IV indicated in FIG. 1.

FIG. 2 is a cross sectional view of two PD elements, 6c and 6d, and FIG. 3 magnifies the PD element 6d. Other PD elements, 6a to 6c, have arrangements same with those shown in FIG. 3. FIG. 4 magnifies a portion that couples the PD element 6d with one of the waveguide elements 8d, while, other PD elements, 6a to 6c, and the waveguide elements, 8a to 8c, have same arrangements with those shown in FIG. 4. As shown in FIG. 4, the PD element 6d and the waveguide element 8f are monolithically integrated on a substrate 10 that may be made of semi-insulating indium phosphide (InP).

As shown in FIG. 3, the PD element 6d includes, on the substrate 10, an conducting layer 11 highly doped with n-type impurities and a PD structure 19A with a type of waveguide in a region D of the conducting layer 11. The PD structure 19A includes, on the conducting layer 11, an absorption layer 13, a p-type cladding layer 14 on the absorption layer 13, and a p-type contact layer 15 on the p-type cladding layer 14. The PD elements 6d further provides a buffer layer 12 between the conducting layer 11 and the absorption layer 13. Thus, the conducting layer 11, the p-type cladding layer 14, and the p-type contact layer 13 are the first to third layers in the present embodiment, while, the buffer layer 12 is the fourth layer in the present embodiment.

The conducting layer 11 may be made of InP doped with silicon (Si) by density greater than, for instance, $1 \times 10^{17}$ cm$^{-3}$ and have a thickness of 1 to 2 µm. The buffer layer 12 may be an n-type layer doped with n-type impurities by density smaller than that in the conducting layer 11, for instance, the density smaller than $1 \times 10^{16}$ cm$^{-3}$ when the impurity is Si, or in an alternative, the buffer layer is an intrinsic type (i-type) layer intentionally doped with no impurities. The buffer layer 12 has bandgap energy greater than that of the absorption layer 13 but smaller than, or equal to, the bandgap energy of the conducting layer 11. In an example, the buffer layer 12 is Si-doped InP with a thickness of 0.1 to 0.3 µm.

The absorption layer 13 may be made of $In_xGa_{1-x}As$ (0<x<1) with a bandgap wavelength longer than 1612 nm, for instance, 1650 nm, where a bandgap wavelength corresponds to an inverse of the bandgap energy, which means that the absorption 13 layer shows sensitivity in the L-band. Specifically, the absorption layer 13 may be an undoped InGaAs, or an n-type InGaAs doped with Si by density less than $3 \times 10^{16}$ cm$^{-3}$. The absorption layer 13 has a thickness of 0.1 to 0.4 µm, preferably, a thickness of 0.2 to 0.3 µm. The p-type cladding layer 14 is made of p-type InP doped with zinc (Zn) by density greater than $2 \times 10^{17}$ cm$^{-3}$ and has a thickness of 1.0 to 2.5 µm. The p-type contact layer 15 may be made of InGaAs also doped with Zn by density greater than $1 \times 10^{18}$ cm$^{-3}$ and has a thickness of 0.1 to 0.3 µm.

The buffer layer 12, the absorption layer 13, the p-type cladding layer 14, and the p-type contact layer 15 collectively form a mesa 70 with a pair of sides each extending along an optical axis of the waveguide element 8f, namely, perpendicular to the page of FIG. 3 and parallel to the page of FIG. 4. The mesa 70 in the sides thereof are covered with a protecting layer 71 made of iron-doped (Fe-doped) InP that shows a semi-insulating characteristic. The mesa 70 has a width of 1.5 to 3.0 µm and a height of 2.0 to 3.5 µm, each perpendicular to the optical axis thereof.

The PD element 6d further provides two insulating films, 16 and 17, that cover and protect the protecting layer 71 and the mesa 70. The insulating films, 16 and 17, are made of inorganic material containing silicon (Si), typically silicon nitride (SiN), silicon oxide (SiO$_2$), silicon oxy-nitride (SiON), and so on. The insulating films, 16 and 17, collectively provide an opening in a top of the mesa 70 that exposes the p-type contact layer 15 to which a p-type electrode 31 is in contact. The p-type electrode 31 may be formed by alloying a eutectic material of gold zinc (AuZn), or AuZn with platinum (Pt) layer. Provided on the p-type electrode 31 is an interconnection 32 that extends along the mesa 70 and connects the p-type electrode 31 with the signal pad 21d. The interconnection 32 is formed by stacked metals of titanium-tungsten (TiW) and gold (Au), TiW/Au, or, in an alternative, stacked metals of titanium (Ti), platinum (Pt), and gold (Au), Ti/Pt/Au; while, the signal pad 21d may be formed by plating gold (Au) on the interconnection 32.

The insulating films, 16 and 17, further provides another opening on the conducting layer 11 in a region adjacent to the mesa 70, through which the n-type electrode 41 is in contact with the conducting layer 11 as a cathode of the PD element 6d. The n-type electrode 41 is physically apart from the buffer layer 12, and may be formed by alloying eutectic metal of gold germanium (AuGe), or AuGe containing nickel (Ni). Provided on the n-type electrode 41 is a bias interconnection 42 that extends to a portion beneath the capacitor element 7d to become the lower metal layer thereof. Thus, the bias interconnection 42 connects the n-type electrode 41 with the capacitor element 42.

Next, the waveguide elements, 8c to 8f, in the cross section thereof will be described. FIG. 4 includes the cross sectional structure of the waveguide element 8f taken in a plane parallel to the optical axis thereof. Other waveguide elements, 8c to 8e have the cross sectional structure same with that shown in FIG. 4. The waveguide element 8f includes the conducting layer 11 on the substrate 10 and the waveguide structure 80 formed on the conducting layer 11 in a region E next to the region D of the PD element 6d. The waveguide structure 80 includes from a side of the conducting layer 11, the buffer layer 12, a core layer 81 and a cladding layer 82.

The conducting layer 11, which is common to the conducting layer 11 in the PD element 6d extending from the PD element 6d to the waveguide element 8f, operates as a lower cladding layer in the waveguide element 8f. The buffer layer 12, which is also common to the buffer layer 12 in the PD element 6d, may also operate as the lower cladding layer of the waveguide element 8f. The buffer layer 12 extends from the PD element 6d, exactly, between the conducting layer 11 and the absorption layer 13 in the PD element 6d, to the waveguide element 8f, exactly, between the conducting layer 11 and the core layer 81 of the waveguide element 8f.

The waveguide element 8f forms a butt joint against the PD element 6d such that the core layer 81 in the waveguide element 8f is in contact with the absorption layer 13 in the PD element 6d, which enables an optical coupling between the core layer 81 and the absorption layer 13. The core layer 81 may be made of material having refractive index thereof greater than that of the conducting layer 11 and that of the buffer layer 12, and a lattice constant matching with that of the buffer layer 12, which is typically, InGaAsP. In an embodiment, the core layer 81 is made of InGaAsP with the bandgap wavelength of 1.05 μm and a thickness of 0.3 to 0.5 μm.

The cladding layer 82 may be made of material with refractive index smaller than that of the core layer 81 and a lattice constant thereof matching with the core layer 81, that is, the cladding layer 82 is typically made of InP with a thickness of 1.0 to 3.0 μm such that the cladding layer 82 in a top thereof is leveled with a top of the p-type contact layer 15 in the PD element 6d. The conducting layer 11 in a portion thereof, the buffer layer 12, the core layer 81, and the cladding layer 82 in the waveguide element 8f make a mesa covered with the insulating films, 16 and 17. This mesa surrounded with the insulating films, 16 and 17, and the layer structure from the conducting layer 11 to the cladding layer 82 in the mesa may effectively confine the signal components, $L_{C1}$ to $L_{C4}$, to provide those signal components, $L_{C1}$ to $L_{C4}$, to the PD elements, 6a to 6d.

Table below compares a structure, in particular, physical dimensions thereof in a unit of micron-meter (μm), of an optical coupler 5 for the C-band, namely, 1528 to 1565 nm, with that for the L-band, where PSX corresponds to a maximum space between the waveguide elements, 8g and 8h, in the phase shifter 8i.

|  | C-band | L-band | difference |
|---|---|---|---|
| $W_1$ | 22 ± 1 | 22 ± +1 | 0 |
| $L_1$ | 340.3 ± 0.1 | 330.7 ± 0.1 | −9.6 |
| $W_2$ | 6.7 ± 0.1 | 6.7 ± 0.1 | 0 |
| $L_2$ | 186 ± 1 | 179 ± 1 | −7 |
| PSX | 1.99 ± 0.01 | 2.02 ± 0.01 | +0.03 |

The optical coupler 5 for the C-band is generally designed so as to maximize transmittance of the signal components, $L_{C1}$ to $L_{C4}$, and to minimize a deviation in output power between the two signal components, $L_{C1}$ and $L_{C2}$, of the in-phase component and a deviation in the output power between the two signal components, $L_{C3}$ and $L_{C4}$, of the quadrature component around the center wavelength of 1550±10 nm. An optical coupler applicable to the L-band is also generally designed so as to maximize the transmittance of the signal components, $L_{C1}$ to $L_{C4}$, and to minimize the deviation in the output power between the two signal components, $L_{C1}$ and $L_{C2}$, of the in-phase component and that between the signal components, $L_{C3}$ and $L_{C4}$, of the quadrature component. The optical coupler shown in the table above equalizes the widths, $W_1$ and $W_2$, of the MMI couplers, 51 and 52, but the lengths and the PSXs are discriminated. The widths, $W_1$ and $W_2$, are at least one digit smaller than the lengths, $L_1$ and $L_2$; accordingly, two types of the optical couplers each applicable to the C-band and the L-band become insensitive to instability of a process of forming the optical coupler. Specifically, an optical coupler for the L-band shortens the lengths $L_1$ by 9.6 μm and $L_2$ by 7.0 μm, but widens the PSX by 0.03 μm.

Figure 6:
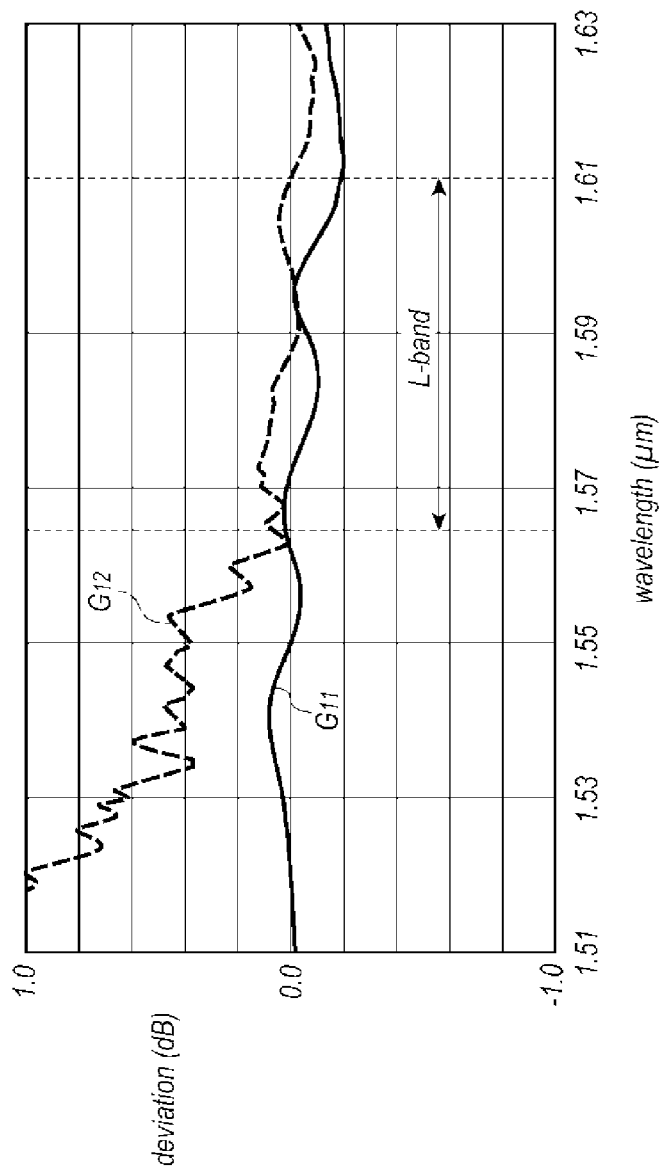
FIG. 6 shows differences in output power between an in-phase component and a quadrature component in the signal components each output from the optical coupler shown in FIG. 5 designed for the L-band.
Figure 7:
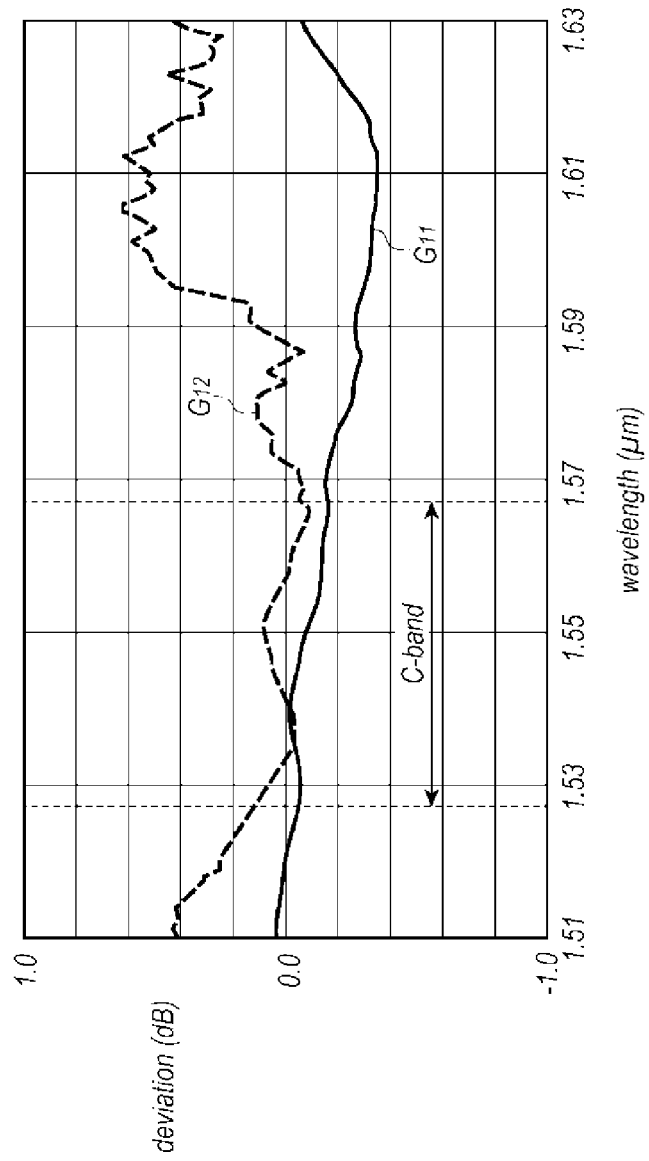
FIG. 7 shows differences in the output power between the in-phase components and the quadrature phase components of the signal components output from the optical coupler designed for the C-band.

FIG. 6 shows the deviations in the output power of the optical coupler between the in-phase components, $L_{C1}$ and $L_{C2}$, denoted by a behaver G11, and between the quadrature components, $L_{C3}$ and $L_{C4}$, denoted by another behavior G12, respectively, where the optical coupler 5 is designed for the L-band. Contrary, FIG. 7 shows the deviations in the output power between the in-phase components, $L_{C1}$ and $L_{C2}$, by a behavior G11 and between the quadrature components, $L_{C3}$ and $L_{C4}$, by another behavior G12, respectively, for the optical coupler designed in the C-band. In FIG. 6 and FIG. 7, the horizontal axis corresponds to the wavelength, while, the vertical axis shows the deviation. As shown in FIG. 6, the optical coupler for the L-band suppresses the deviation less than ±0.2 dB in the output power thereof between both the in-phase components and between the quadrature components in the L-band. Also, as shown in FIG. 7, the optical coupler for the C-band may suppress the deviations both between the in-phase components and between the quadrature components in the C-band.

Figure 8:
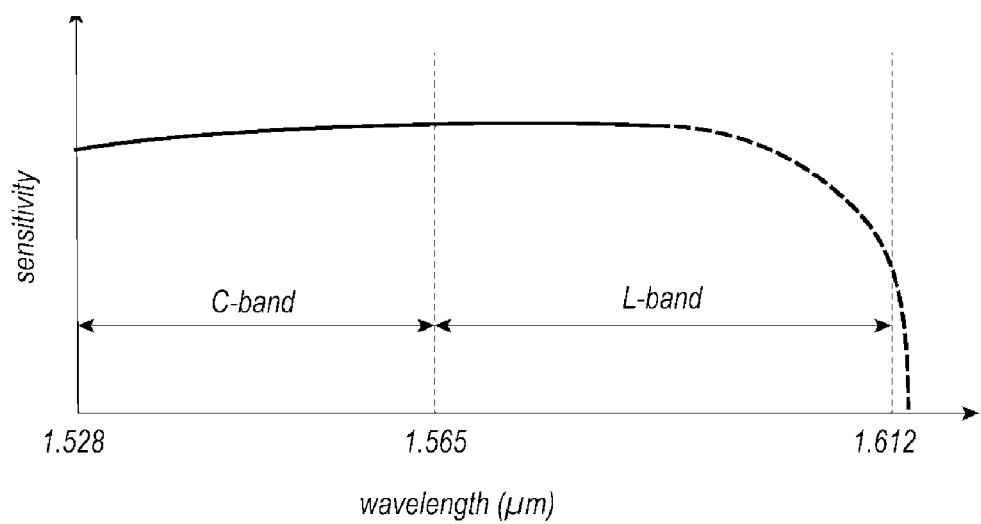
FIG. 8 schematically shows wavelength dependence of sensitivity of a generally available PD element.

As shown in FIG. 4, the absorption layer 13 in the PD element 6d directly couples with the core layer 81 in the waveguide element 8f, which means that the optical sensitivity of the PD device 2A may be determined by transmittance in the optical coupler 5, that of the waveguide elements, 8a to 8f, and the sensitivity of the PD elements, 6a to 6d. Because the L-band is closer to the bandgap wavelength of $In_xGa_{1-x}As$ (0<x<1) lattice matching with InP, which is 1650 nm; the absorption layer 13 in the PD element, 6a to 6d, inherently shows a large temperature dependence in an absorption co-efficient thereof. Moreover, when an ambient temperature lowers, the bandgap wavelength of the absorption layer 13 further shifts toward a shorter wavelength, namely, further closer to the L-band, which means that the sensitivity of the PD devices, 6a to 6d, show tendency of insufficient for the PD device 2A. FIG. 8 schematically shows the sensitivity of the PD elements, 6a to 6d, against the wavelength, where the horizontal axis corresponds to the wavelength, and the vertical axis corresponds to the sensitivity. Because the bandgap wavelength of the absorption layer 13 locates closer to the maximum wavelength in the L-band, exactly, 1650 nm in the present embodiment; the sensitivity degrades in wavelengths closer to the longest wavelength in the L-band. Moreover, as the temperature lowers, which shifts the bandgap wavelength of the absorption layer in shorter wavelengths, the decrement of the sensitivity definitely becomes a subject.

Figure 9:
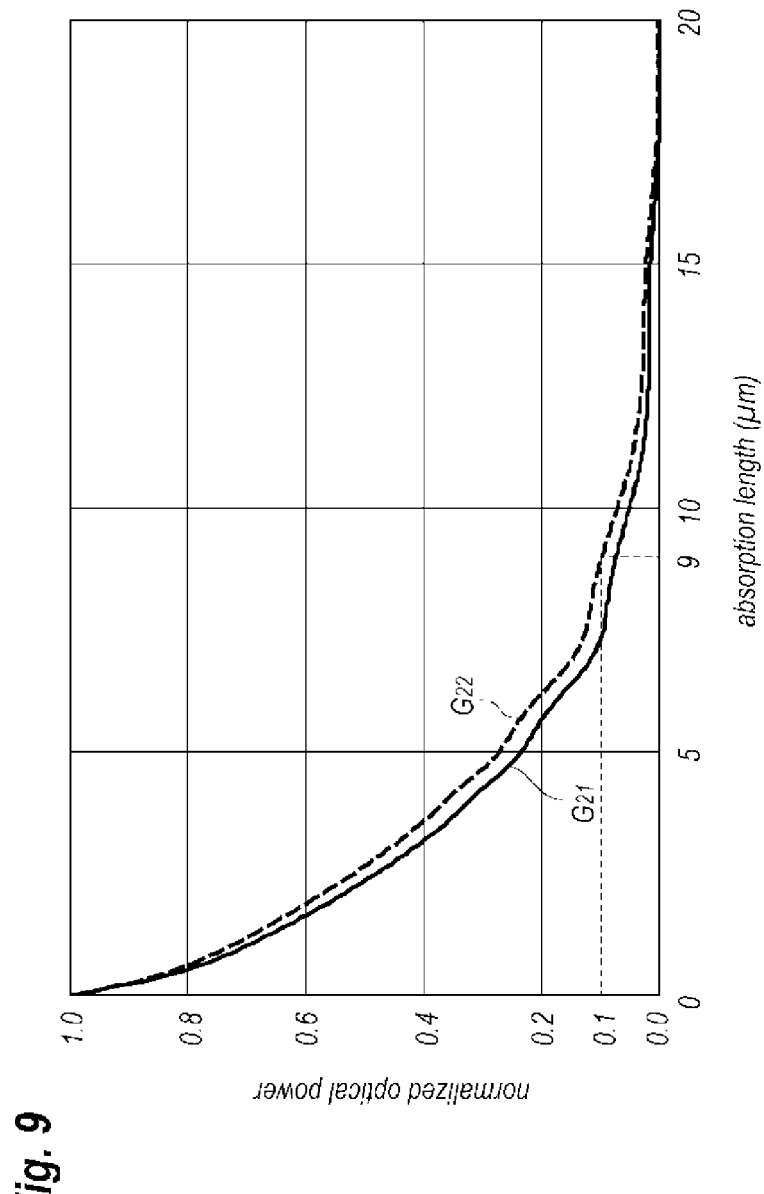
FIG. 9 shows normalized power distribution in the absorption layer of a PD element at a wavelength in the C-band.
Figure 10:
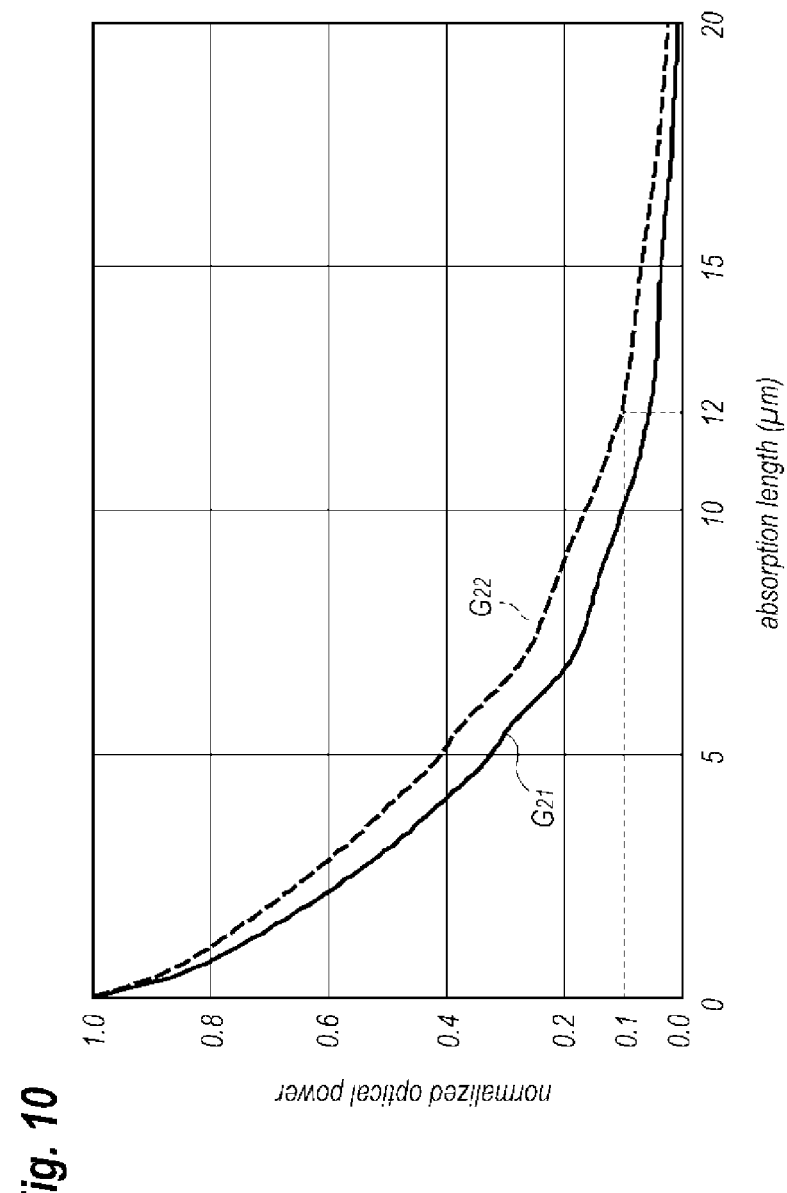
FIG. 10 shows the normalized power distribution in the absorption layer of a PD element at a wavelength in the L-band.

The PD elements, 6a to 6d, for the L-band according to the present embodiment extend the length $L_3$ thereof along the optical axis of the waveguide elements, 8c to 8f, compared with a PD element designed for the C-band. Specifically, the length $L_3$ of the PD elements, 6a to 6d, are set to be greater than 12 μm, while, that of a PD element for the C-band is set to be 9 μm. FIG. 9 and FIG. 10 show power distribution in the absorption layer 13 of a PD element for the C-band and the L-band, respectively, where the power distribution is measured from an interface against the core layer 81, which is the left end in the horizontal axis, and normalized by a value at the interface. In FIG. 9 and FIG. 10, a behavior G21 corresponds to the distribution at a temperature of 25° C., while, another behavior G22 corresponds to the distribution at a temperature of −40° C. The difference between two behaviors, G21 and G22, becomes smaller for the PD element designed in the C-band shown in FIG. 9 because the C-band is relatively apart from the bandgap wavelength of the absorption layer 13. Contrary, another PD element for the L-band shown in FIG. 10 causes a larger difference reflecting the greater temperature dependence of the absorption co-efficient, as shown in FIG. 10. The absorption co-efficient of the absorption layer 13 in a PD element for the C-band becomes small at a lower temperature, which leaves the substantial distribution denoted by the behavior G22 in FIG. 10 even at a region apart from the interface against the waveguide element.

A PD element for the C-band leaves the normalized power distribution of 0.1 at a point apart from the interface by 9 µm at temperatures of both 25° C. and −45° C., as shown in FIG. 9. On the other hand, for another PD element for the L-band, as shown in FIG. 10, the normalized power distribution within in the absorption layer at a point apart from the interface by 9 µm becomes 0.14 at a temperature of 25° C., but becomes about 0.1 at the temperature of −40° C. However, the normalized power distribution is left around 0.1 at −40° C. even at a point apart from the interface by 12 µm. That is, in order to realize the sensitivity, which is comparable to that realized in a PD element for the C-band, by a PD element for the L-band, the PD element for the L-band is necessary to extend the length of the absorption layer 13 along the optical axis of the waveguide element more than 30% compared with that of the PD element for the C-band. However, a lengthened absorption layer in a PD element results in an increase of parasitic capacitance attributed to a p-n junction within the PD element. Accordingly, the PD element applicable to the L-band preferably has the absorption layer 13 with a length L3 shorter than 19 µm.

Figure 11:
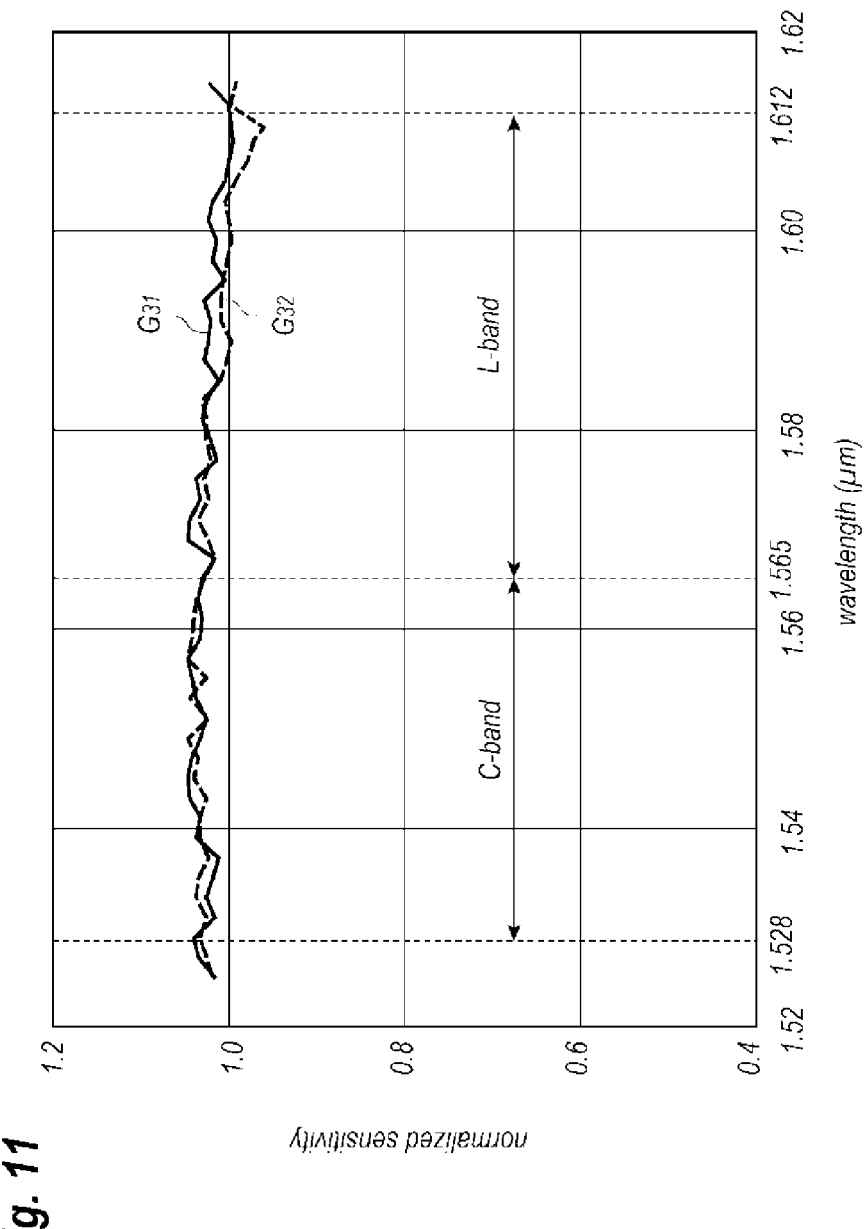
FIG. 11 shows wavelength dependence of normalized sensitivity of a PD element of an embodiment of the present invention, where the PD element has a length of 12 µm along an optical axis thereof.

FIG. 11 shows the sensitivity of the PD elements, 6a to 6d, according to the present embodiment, where the PD elements, 6a to 6d, have the absorption layer 13 with the length $L_3$ of 12 µm. In FIG. 11, behaviors, G31 and G32, correspond to the sensitivity measured at temperatures of 25° C. and −5° C., respectively. The sensitivity in the vertical axis is normalized by a value at the wavelength of 1.615 µm. As shown in FIG. 11, the normalized sensitivity at the respective temperatures becomes closer not only in the C-band but in the L-band.

Thus, the PD device 2A having PD elements with the type of the waveguide provides the absorption layer 13 having the length thereof greater than 12 µm along the optical axis thereof, which may compensate the decrement in the optical sensitivity at a low temperature, and the PD elements, 6a to 6d, implemented in the PD device 2A have enough sensitivity for the signal components in the L-band. Also, the absorption layer 13 primarily includes $In_xGa_{1-x}As$ (0<x<1) with a thickness of 100 to 200 nm. A thicker absorption layer in a PD element degrades the frequency response thereof because a carrier transporting time within the absorption layer, in particular, the transporting time of the p-type carriers, increases. Thus, a thinner absorption layer is preferable for a PD element in the PD device 2A. However, a thinner absorption layer decrease absolute amount of the absorption, which results in degradation of the sensitivity of the PD element. The absorption layer 13 of the present embodiment provides the prolonged length along the optical axis thereof, which secures enough amount of the absorption. Accordingly, the PD element of the embodiment having the prolonged absorption layer 13 may enhance the frequency response.

The frequency response of the PD elements, 6a to 6d, depends on a time constant determined by the junction capacitance and the series resistance, and the carrier transporting time in the absorption layer 13. A thicker absorption layer reduces the junction capacitance but increases the carrier transporting time. Contrary, a thinner absorption layer may shorten the carrier transporting time but increases the junction capacitance, which increase the time constant of the absorption layer. That is, the optical sensitivity and the frequency response have a trade-off relation.

Figure 14:
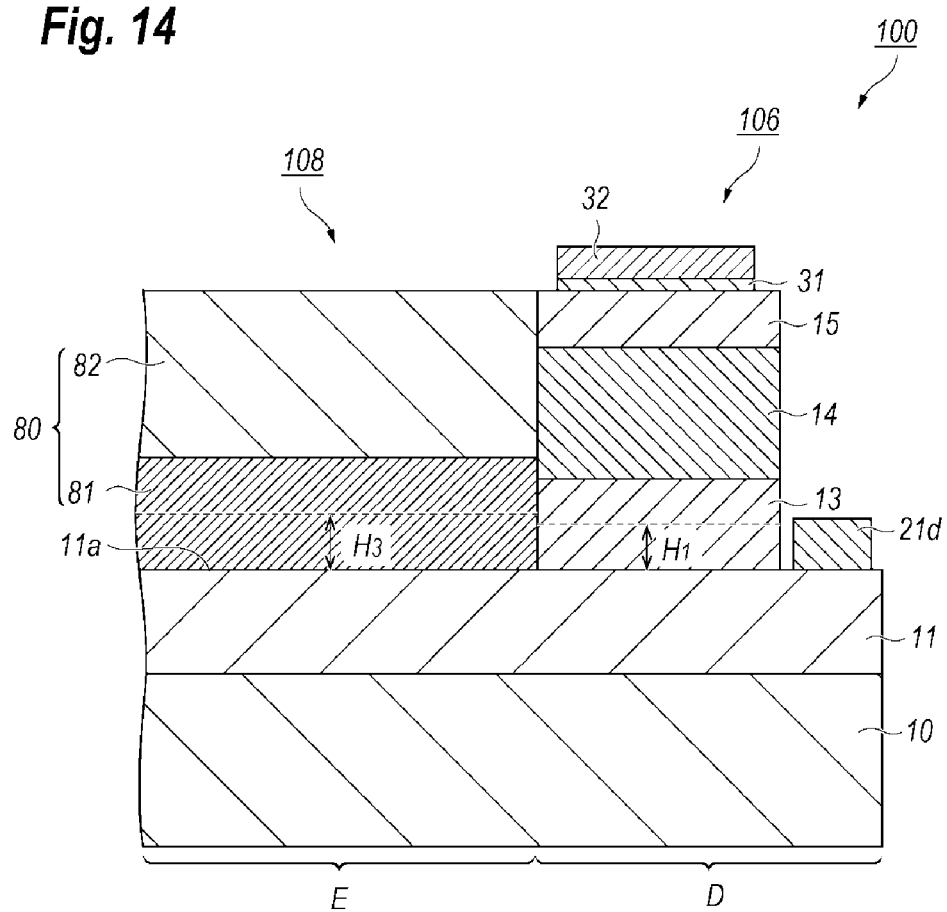
FIG. 14 is a cross section view of a PD element and a waveguide element according to a conventional arrangement.

The PD elements, 6a to 6d, of the present embodiment provides the buffer layer 12, which is the n-type conduction with the impurity density less than that of the conducting layer 11, or the i-type unintentionally doped, between the conducting layer 11 and the absorption layer 13 and between the conducting layer 11 and the core layer 81 in the waveguide elements, 8c to 8f, continuous to the PD elements, 6a to 6d. This arrangement including the buffer layer 12 may expand the depletion layer at a reverse bias from the absorption layer 13 to the buffer layer 12, which reduces the junction capacitance compared with another arrangement without any buffer layer and reduces the time constant of the absorption layer 13, which is shown in FIG. 14. That is, even when the absorption layer 13 is thinned to shorten the carrier transporting time, the PD elements, 6a to 6d, may suppress the increase of the capacitance, namely, the increase of the time constant thereof.

The buffer layer 12 may exist in the waveguide element 8f, exactly, between the conducting layer 11 and the core layer 81. The conducting layer 11 is highly doped with the n-type impurities, and those impurities possibly become scattering centers for photons propagating in the core layer 81, which increases the optical loss in the waveguide structure 80. The buffer layer 12 provided between the conducting layer 11 and the core layer 81 may suppress the possibility of the scattering cross section by the impurities in the conducting layer 11.

The buffer layer 12 may have the doping density less than $1 \times 10^{16}$ cm$^{-3}$ to enough expand the depletion region at a reverse bias. The buffer layer 12 may have the bandgap energy greater than that of the absorption layer 13 but equal to or smaller than that of the conducting layer 11 to effectively confine the signal components within the core layer 81. The waveguide structure 80 may optically couple with an optical fiber carrying the optical signal whose wavelength is within the range of 1565 to 1612 nm, namely, in the L-band.

First Modification

Figure 12:
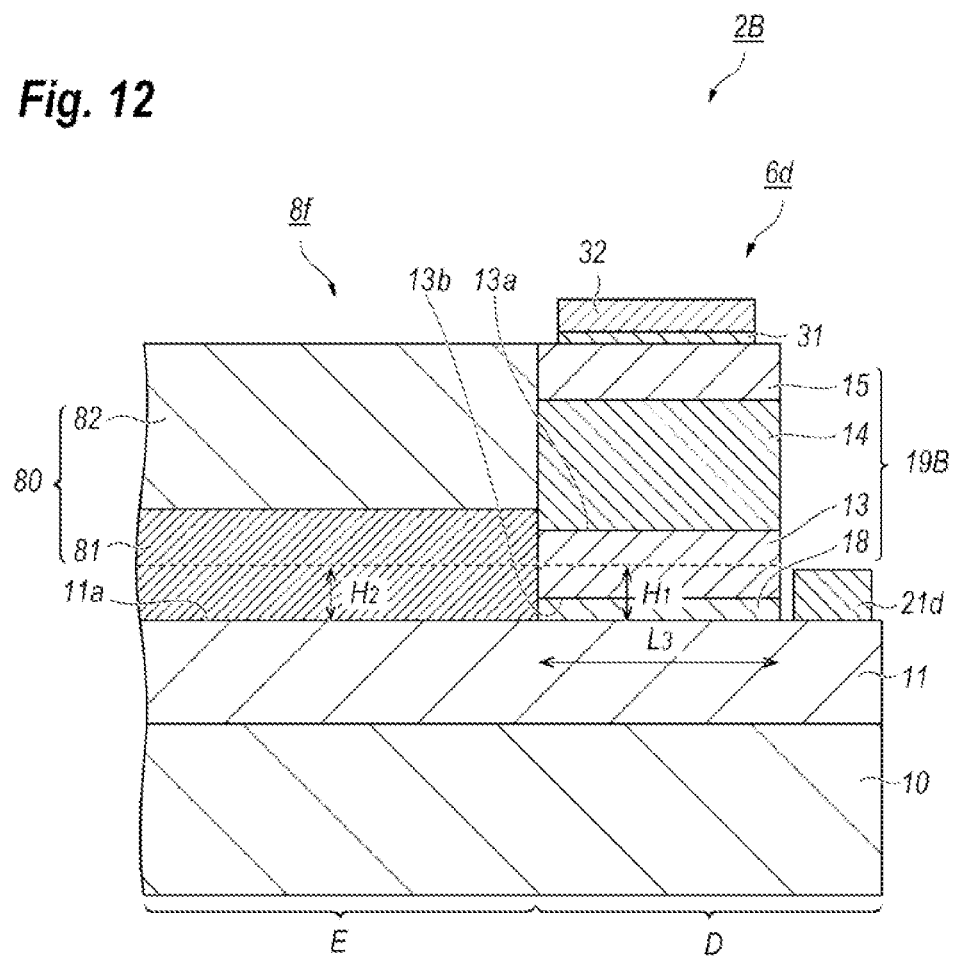
FIG. 12 is a cross sectional view of another PD element and another waveguide element that are modified from the PD element and the waveguide element shown in FIG. 4.

FIG. 12 is a cross sectional view of another PD device 2B that includes another PD element 6d and another waveguide element 8f, where FIG. 12 is taken along the line IV-IV indicated in FIG. 4. Both elements, 6d and 8f, are modified from the PD element 6d and the waveguide element 8f shown in FIG. 4. The arrangement of the PD device 2B shown in FIG. 12 has a feature that the PD device 2B omits the buffer layer 12 common to the PD element 6d and the waveguide element 8f but further provides an intermediate layer 18 in the PD element 6d. Other arrangements are substantially same with those shown in FIG. 4.

The PD element 6d includes, on the substrate 10, the conducting layer 11 and the PD structure 19B formed on the conducting layer 11 in the region D. The PD structure 19B provides stacked layers of, from the side of the conducting layer 11, the intermediate layer 18, the absorption layer 13, the p-type cladding layer 14, and the contact layer 15. The arrangements of those layers except for the intermediate layer 18 including dimensions and doping conditions are same with those explained in FIG. 4. Also, the absorption layer 13 preferably has the length L3 at least greater than 12 µm along the optical axis thereof.

The intermediate layer 18 may be an undoped layer, or slightly doped with n-type impurities by density less than that of the conducting layer 11 and has bandgap energy greater than that of the absorption layer 13 but smaller than that of the conducting layer 11. The intermediate layer 18 of the present embodiment is made of InGaAsP doped with silicon (Si) by density less than $1 \times 10^{16}$ cm$^{-3}$ and having a bandgap wavelength of 1.4 µm. The intermediate layer 18 preferably has a thickness of 0.1 to 0.2 µm.

FIG. 12 indicates a height $H_1$ of the absorption layer 13 measured from a top 11a of the conducting layer 11 to the middle of the absorption layer 13; that is to a virtual plane with even spans against a top 13a and a bottom 13b of the absorption layer 13. The intermediate layer 18 may show a function to moderate discrepancy (ΔEc) in the conduction band between the conducting layer 11 and the absorption layer 13. The intermediate layer 18 may be a graded layer in composition thereof to moderate the bandgap discrepancy ΔEc. Specifically, the intermediate layer 18 may include two layers each made of Si-doped InGaAsP but compositions thereof are different from each other, where one of the Si-doped InGaAsP layer in contact with the conducting layer 11 has the bandgap wavelength of 1.1 µm, while, the other Si-doped InGaAsP layer in contact with the absorption layer 13 may have the bandgap wavelength of 1.3 µm. Doping density of both layers is preferably less than $1 \times 10^{16}$ cm$^{-3}$.

The PD element 6d may further provide another intermediate layer also made of InGaAsP between the absorption layer 13 and the p-type cladding layer 14 in order to enhance high frequency response of the PD element 6d by reducing a carrier transporting time. Also, the other intermediate layer between the absorption layer 13 and the p-type cladding layer 14 may be a graded layer in the composition thereof to moderate the discrepancy ΔEv in the valence band therebetween. This composition graded layer may include two layers each made of un-doped InGaAsP, or doped with Zn by density less than $1 \times 10^{17}$ cm$^{-3}$, and have bandgap wavelengths of 1.3 µm and 1.1 µm, respectively.

Also, the PD element 6d may further provide still another layer to moderate the bandgap discrepancy between the p-type cladding layer 14 and the p-type contact layer 15. The layer may be doped with Zn by density greater than $1 \times 10^{18}$ cm$^{-3}$. The layer may be constituted by two layers each made of Zn-doped InGaAsP and having bandgap wavelengths of 1.1 µm and 1.3 µm, respectively.

The waveguide elements, 8c to 8f, of the present modified PD device 2B, where the waveguide element 8f is representatively explained in the following specification, includes the conducting layer 11 on the substrate 10 and the waveguide structure 80 on the conducting layer 11 in the region E neighbor to the region D. The waveguide element 8f couples with the PD element 6d by the butt joint such that the core layer 81 in the waveguide structure 80 is in direct contact with the absorption layer 13. Also, the core layer 81 is in contact with the intermediate layer 18 by the butt joint therebetween. Thus, a bottom of the core layer 81 and a bottom of the intermediate layer 18 are both in direct contact with the top of the conducting layer 11.

FIG. 12 indicates a height $H_2$ of the core layer 81 measured from the top 11a of the conducting layer 11 to a virtual plane equally apart from the bottom and the top of the core layer 81. The height $H_2$ is substantially equal to the height $H_1$ of the absorption layer 13, which means that the middle of the core layer 81 is substantially leveled with the middle of the absorption layer 13.

In the PD device 2B thus described, the absorption layer 13 has the length $L_3$ greater than 12 µm that is same with the PD device 2A of the aforementioned embodiment, which may secure enough sensitivity in the L-band even at a low temperature. Also, the PD elements, 6a to 6d, of the present modification provides the intermediate layer 18 with the n-type conduction by slightly doping n-type impurities, or the i-type by intentionally doping no impurities. This arrangement including the intermediate layer 18 may expand the depletion layer in the absorption layer 13 to the intermediate layer 18 at a reverse bias, which may thin the absorption layer 13 to shorten the carrier transporting time without increasing the capacitance attributed to the absorption layer 13. The PD elements, 6a to 6d, may enhance the frequency response.

The intermediate layer 18 in the present modification abuts the core layer 81 against the conducting layer 11. When the core layer 81 and the absorption layer 13 are arranged directly on the conducting layer 11 and the absorption layer 13 is thinned in order to enhance the frequency response; the absorption layer 13 is hard to be abutted against the core layer 81. That is, the height $H_1$ of the absorption layer 13 measured from the top of the conducting layer 11 is misaligned with the height $H_3$ of the core layer 81, which degrades the optical coupling efficiency between two layers, 13 and 81, and the optical sensitivity of the PD elements, 6a to 6d. The intermediate layer 18 may equalize the two heights, H1 and H3, even when the absorption layer 13 is formed thin and may suppress the degradation in the optical coupling efficiency between two layers, 13 and 81.

Also, the stacking structure sandwiching the absorption layer 13 may be symmetrical with respect to the absorption layer 13. Semiconductor layers, 14 and 15, showing the p-type conduction and provided above the absorption layer 13, which are made of p-type InP and p-type InGaAsP, respectively, inherently shows a greater optical loss compared with n-type materials for the semiconductor layers, 11 and 18 under the absorption layer 13, namely, the n-type conducting layer 11 and the intermediate layer 18 because of greater absorption of free carriers in the p-type materials. The intermediate layer 18 with lessor carrier concentration may moderate a difference in the refractive index between the conducting layer 11 and the absorption layer 13 at the interface therebetween leaving the difference in the refractive index between the absorption layer 13 and the p-type cladding layer 14 comparably greater. Accordingly, the optical confinement function against the p-type cladding layer 14 may be reduced, which suppresses the optical loss in the absorption layer 13.

The intermediate layer 18 may have the doping density less than $1 \times 10^{16}$ cm$^{-3}$, which may expand the depletion region of the absorption layer 13 to the intermediate layer 18 when the PD element is reversely biased. Also, the intermediate layer 18 in the bandgap energy thereof may be greater than that of the absorption layer 13 bur smaller than or equal to that of the conducting layer 11 to expand the depletion region in the absorption layer to at a reverse bias to the intermediate layer 18.

Also, the conducting layer 11 may have a composition different from the composition of the intermediate layer 18, which may secure etching ratios for the intermediate layer 18 and the conducting layer 11 to form the mesa 70 in the PD elements, 6a to 6d. That is, the conducting layer 11 may operate as an etch stopping layer for forming the mesa 70, which may align the top 11a of the conducting layer 11 in the region D for the PD elements, 6a to 6d, with the top 11a of the conducting layer 11 in the region E for the waveguide elements, 8c to 8f; that is, the height $H_1$ in the PD elements, 6a to 6d, may be leveled with the height $H_2$ in the waveguide elements, 8c to 8f.

FIG. 14 is a cross sectional view of a conventional PD device 100 including a PD element 106 and a waveguide element 108, where the PD element 106 stacks the conducting layer 11 on the substrate 10 in both of the region D for the PD element 106 and the region E for the waveguide element 108 but omits the buffer layer 12 and the intermediate layer 18. Under such an arrangement, when the absorption layer 13 is formed thin for enhancing high frequency response of the absorption, the height $H_1$ of the absorption layer 13 measured from the top of the conducting layer 11 causes misalignment with the height $H_3$ of the core layer 81 measured from the top 11a of the conducting layer 11, which degrades the optical coupling efficiency between two layers, 13 and 81.

Second Modification

Figure 13:
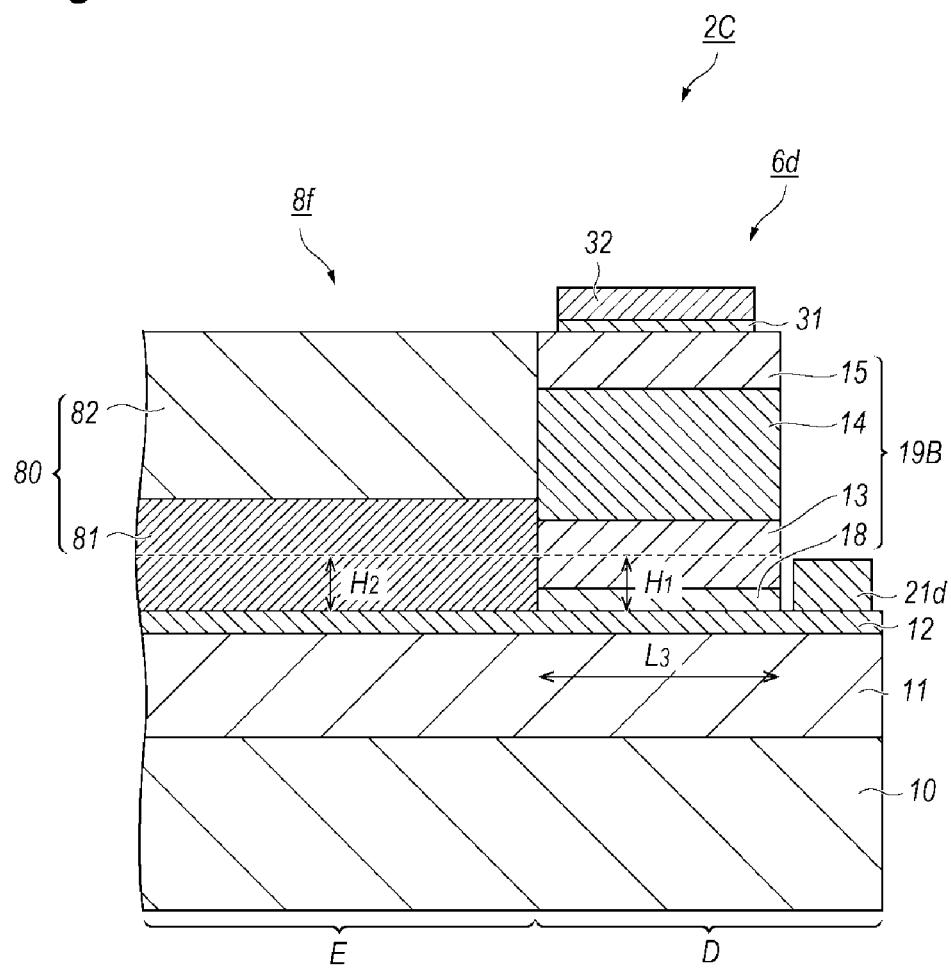
FIG. 13 is a cross sectional view of still another PD element, where the still another PD element is modified from the PD element shown in FIG. 4.

FIG. 13 is a cross sectional view of another PD device 2C also modified from that shown in FIG. 4, where the cross section shown in FIG. 13 is taken along the line IV-IV indicated in FIG. 1. The PD device 2C has a feature of further implementing the intermediate layer 18 without omitting the buffer layer 12. Other arrangements of the PD device 2C are substantially same with those, 2A and 2B, of the aforementioned embodiment.

In the arrangement of the PD device 2C shown in FIG. 13, a depletion layer at a reversed bias expands from the absorption layer 13 to the buffer layer 12 exceeding the intermediate layer 18, which may enable to further thin the absorption layer 13 without increasing the junction capacitance, or parasitic capacitance between the electrodes. A thinned absorption layer 13 may shorten the carrier transporting time within the absorption layer 13, which may enhance the response of the PD elements, 6a to 6d, in higher frequencies. The present modification also extends the buffer layer 12 between the core layer 81 and the conducting layer 11 in the waveguide element 8f, which may suppress optical loss in the waveguide element 8f.

While particular embodiments of the present invention have been described herein for purposes of illustration, many modifications and changes will become apparent to those skilled in the art. For instance, the core layer in the waveguide element in compositions thereof is not restricted to InGaAsP but the core layer may be made of AlInGaAsP. Also, the photodiode device in the embodiments monolithically integrates, on the substrate 10, the waveguide elements, 8a to 8f, and the PD elements, 6a to 6d. However, the substrate 10 may integrate other electronic devices that convert optical signals into electrical signals, such as those including a hetero-bipolar transistor made of InP and materials grouped in InP, capacitors, and resistors. Also, the embodiment provides the conducting layer 11 on the substrate 10, but, the PD devices, 2A to 2C, may omit the conducting layer 11 when the substrate 10 is highly doped with n-type impurities to operate as a conducting layer. Accordingly, the appended claims are intended to encompass all such modifications and changes as fall within the true spirit and scope of this invention.

What is claimed is:

1. A photodiode device, comprising:
   a substrate providing a conducting layer doped with n-type impurities, the conducting layer having a first region and a second region next to the first region;
   a waveguide element provided on the first region of the conducting layer, the waveguide element including:
      a core layer provided on the conducting layer, and
      a cladding layer provided on the core layer; and
   a photodiode element provided on the second region of the conducting layer, the photodiode element being optically coupled with the waveguide element and including:
      an absorption layer that is provided on the conducting layer and has a bandgap wavelength longer than 1612 nm, the absorption layer abutting against the core layer in the waveguide element, and
      a p-type cladding layer that is provided on the absorption layer and doped with p-type impurities,
   wherein the absorption layer in the photodiode element has a length at least 12 μm along an optical axis thereof measured from an interface against the core layer in the waveguide element.

2. The photodiode device according to claim 1, further comprising a buffer layer that is provided on the conducting layer and extends from the first region to the second region,
   wherein the core layer in the waveguide element is provided on the buffer layer, and
   wherein the absorption layer in the photodiode element is provided on the buffer layer.

3. The photodiode device according to claim 2,
   wherein the conducting layer is doped with silicon by density at least $1 \times 10^{17}$ cm$^{-3}$ and the buffer layer is undoped or slightly doped with silicon by density of $1 \times 10^{16}$ cm$^{-3}$ at most.

4. The photodiode device according to claim 2,
   wherein the buffer layer has a thickness of 0.3 μm at most.

5. The photodiode device according to claim 2,
   wherein the buffer layer has a bandgap wavelength shorter than a bandgap wavelength of the absorption layer but longer than or equal to a bandgap wavelength of the conducting layer.

6. The photodiode device according to claim 2,
   wherein the photodiode element further includes an intermediate layer provided on the buffer layer in the second region of the conducting layer, the absorption layer being provided on the intermediate layer but the core layer being provided on the buffer layer.

7. The photodiode device according to claim 6,
   wherein the intermediate layer is undoped or slightly doped with n-type impurities by density of $1 \times 10^{16}$ cm$^{-3}$ at most.

8. The photodiode device according to claim 6,
   wherein the absorption layer has a height measured from a top of the conducting layer to a middle between a top and a bottom of the absorption layer, where the height of the absorption layer is substantially equal to a height of the core layer measured from the top of the conducting layer to a middle between a top and a bottom of the core layer.

9. The photodiode device according to claim 6,
   wherein the intermediate layer includes an upper layer and a lower layer, the upper layer being in contact with the absorption layer, the lower layer being in contact with the conducting layer, and
   wherein the upper layer has a bandgap wavelength shorter than a bandgap wavelength of the absorption layer, the lower layer has a bandgap wavelength shorter than the bandgap wavelength of the upper layer but longer than a bandgap wavelength of the conducting layer.

10. The photodiode device according to claim 1,
    wherein the photodiode element further includes an intermediate layer provided only in the second region of the conducting layer, the absorption layer being provided on the intermediate layer but the core layer in the waveguide element being provided on the conducting layer.

11. The photodiode device according to claim 10, wherein the intermediate layer is undoped or slightly doped with n-type impurities by density of $1\times10^{16}$ cm$^{-3}$ at most.

12. The photodiode device according to claim 10, wherein the absorption layer has a height measured from a top of the conducting layer to a middle between a top and a bottom of the absorption layer, where the height of the absorption layer is substantially equal to a height of the core layer measured from the top of the conducting layer to a middle between a top and a bottom of the core layer.

13. The photodiode device according to claim 10, wherein the intermediate layer includes an upper layer and a lower layer, the upper layer being in contact with the absorption layer, the lower layer being in contact with the conducting layer, and
wherein the upper layer has a bandgap wavelength shorter than a bandgap wavelength of the absorption layer, the lower layer has a bandgap wavelength shorter than the bandgap wavelength of the upper layer but longer than a bandgap wavelength of the conducting layer.

14. The photodiode device according to claim 2, wherein the absorption layer is made of $In_xGa_{1-x}As$ ($0<x<1$) and has a thickness of 0.1 to 0.4 μm.

15. A photodiode device that receives an optical signal and a local signal each having wavelengths substantially equal to each other, the optical signal containing two signal components each having phases different by 90°, the optical device comprising:
a substrate providing a conducting layer thereon, the conducting layer being doped with n-type impurities by density greater than $1\times10^{17}$ cm$^{-3}$ ;
a buffer layer that is provided on the conducting layer,
an optical hybrid that receives the optical signal and the local signal, extracts the two signal components by performing interference between the optical signal and the local signal, and outputs the two signal components;
two photodiode elements each having absorption layers provided on the conducting layer and p-type cladding layers on the absorption layers; and
two waveguide elements that provide the two signal components extracted by the optical hybrid to the two photodiode elements, respectively, the two waveguide elements each having core layers on the conducting layer and cladding layers on the core layers,
wherein the absorption layers each have a length of at least 12 μm measured from respective interfaces against the waveguide elements along optical axes thereof,
wherein the core layers in the waveguide elements are each provided on the buffer layer, and
wherein the absorption layers in the photodiode elements are each provided on the buffer layer.

16. The photodiode device according to claim 15, wherein the buffer layer is undoped or slightly doped with n-type impurities by density of $1\times10^{16}$ cm$^{-3}$ at most.

17. The photodiode device according to claim 15, wherein the buffer layer has a thickness 0.3 μm at most.

18. The photodiode device according to claim 15, wherein the buffer layer has a bandgap wavelength shorter than a bandgap wavelength of the absorption layers but longer than or equal to a bandgap wavelength of the conducting layer.

* * * * *